United States Patent
Ling et al.

(10) Patent No.: US 7,061,659 B2
(45) Date of Patent: Jun. 13, 2006

(54) THERMALLY TUNED FILTER HAVING A PRE-STRESSED MEMBRANE

(75) Inventors: Wenhua Ling, Naperville, IL (US); Marc Finot, Palo Alto, CA (US); Ralph B. Bettman, Mountain View, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/813,956

(22) Filed: Mar. 31, 2004

(65) Prior Publication Data

US 2005/0225823 A1    Oct. 13, 2005

(51) Int. Cl.
*G02B 26/00* (2006.01)
(52) U.S. Cl. .................. 359/237; 359/290; 359/238
(58) Field of Classification Search ............... 359/237, 359/238, 240, 288, 290, 308; 372/20, 34, 372/32; 385/39
See application file for complete search history.

(56) References Cited

U.S. PATENT DOCUMENTS

2001/0028494 A1 * 10/2001 Norwood et al. ........... 359/290
2003/0108306 A1    6/2003 Whitney et al.

* cited by examiner

*Primary Examiner*—Scott J. Sugarman
*Assistant Examiner*—Richard Hanig
(74) *Attorney, Agent, or Firm*—Blakely, Sokoloff, Taylor and Zafman

(57) ABSTRACT

A thermally tuned filter having a pre-stressed membrane. The thermally tuned filter includes a handle layer, a dielectric layer positioned proximate to the handle layer, and a device layer positioned proximate to the handle layer. The device layer includes an optical device. A pre-stressed membrane is positioned proximate to the device layer; a tensile prestress of the pre-stressed membrane increases the natural frequency of the thermally tuned filter.

29 Claims, 11 Drawing Sheets

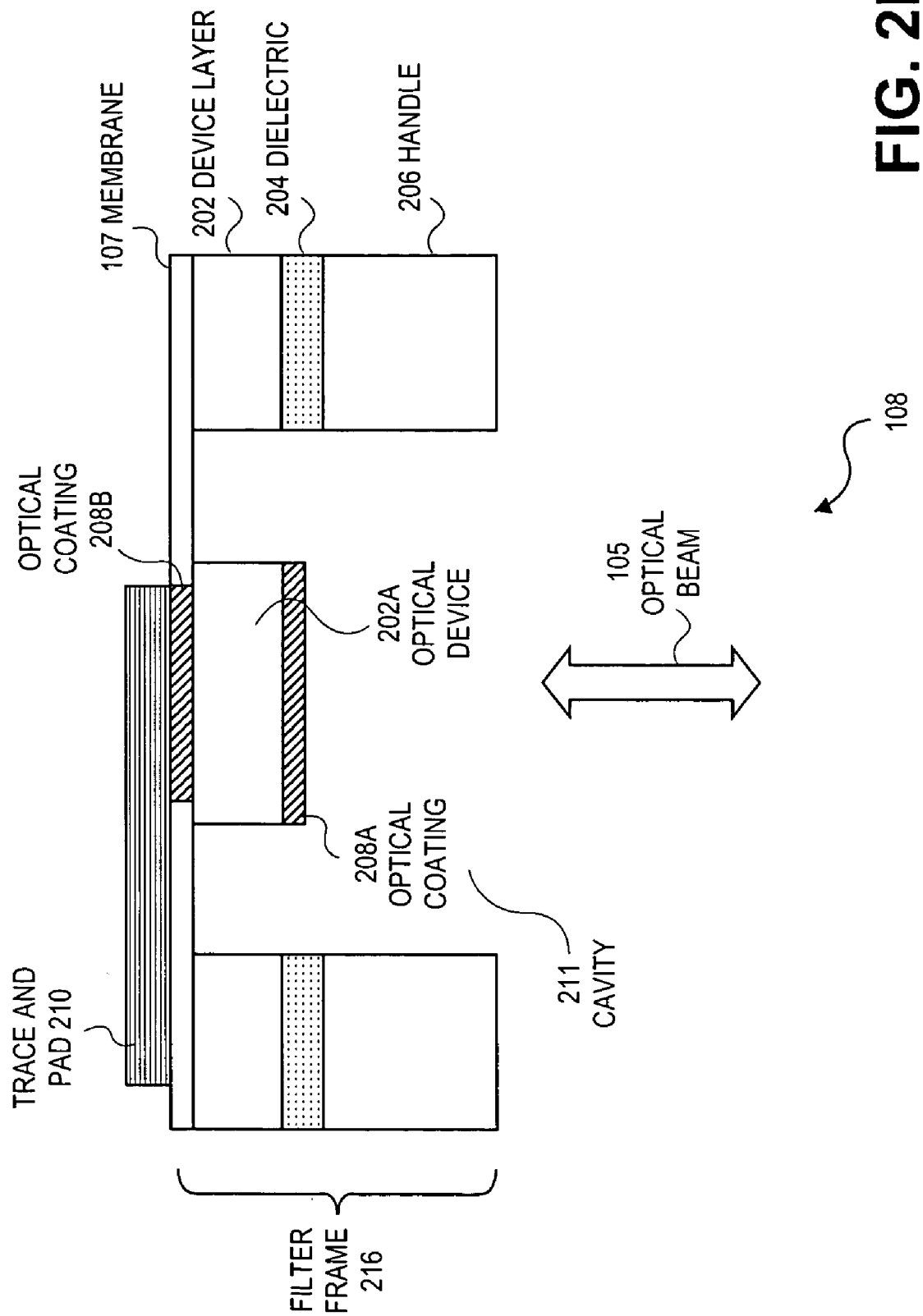

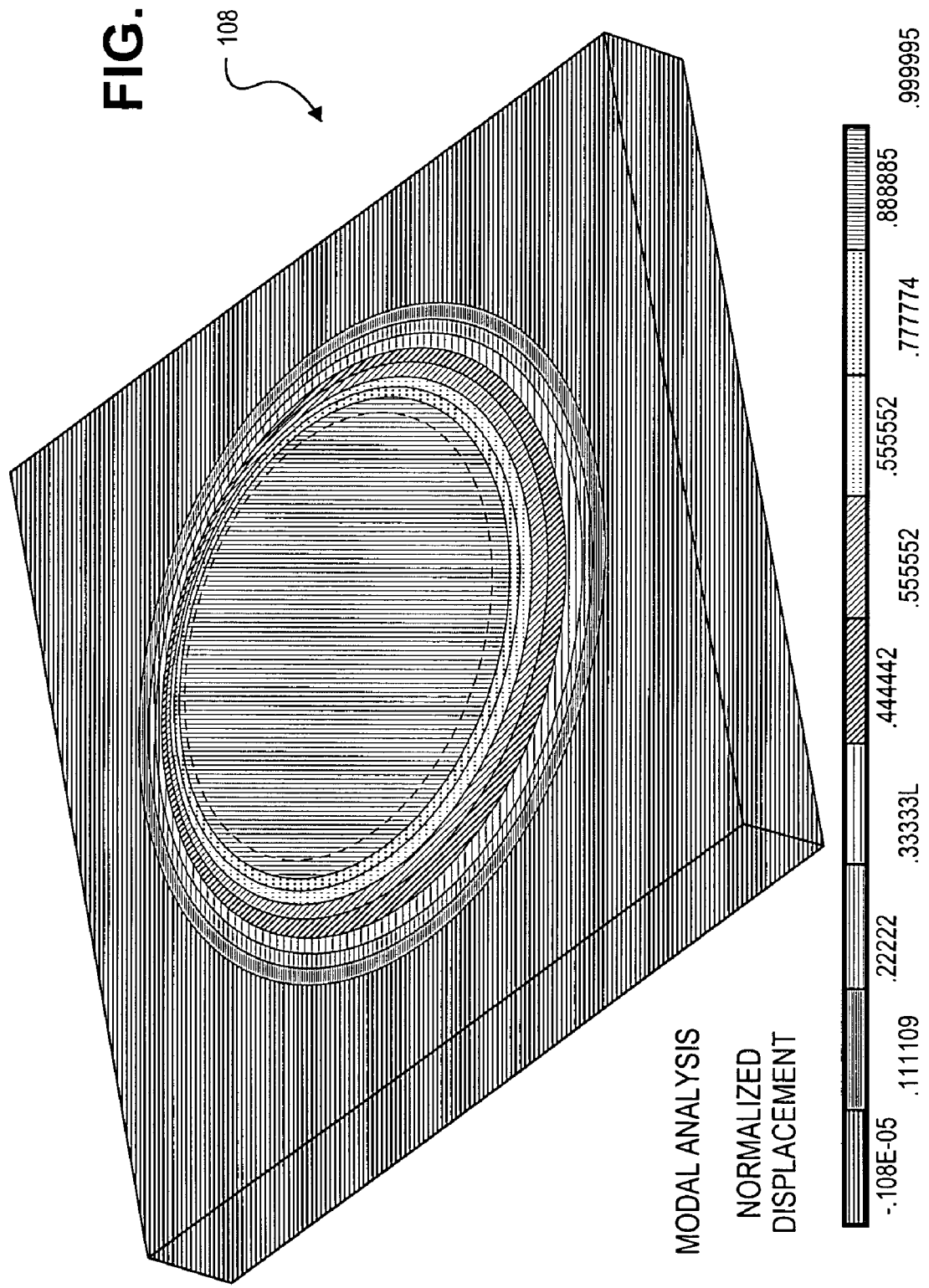

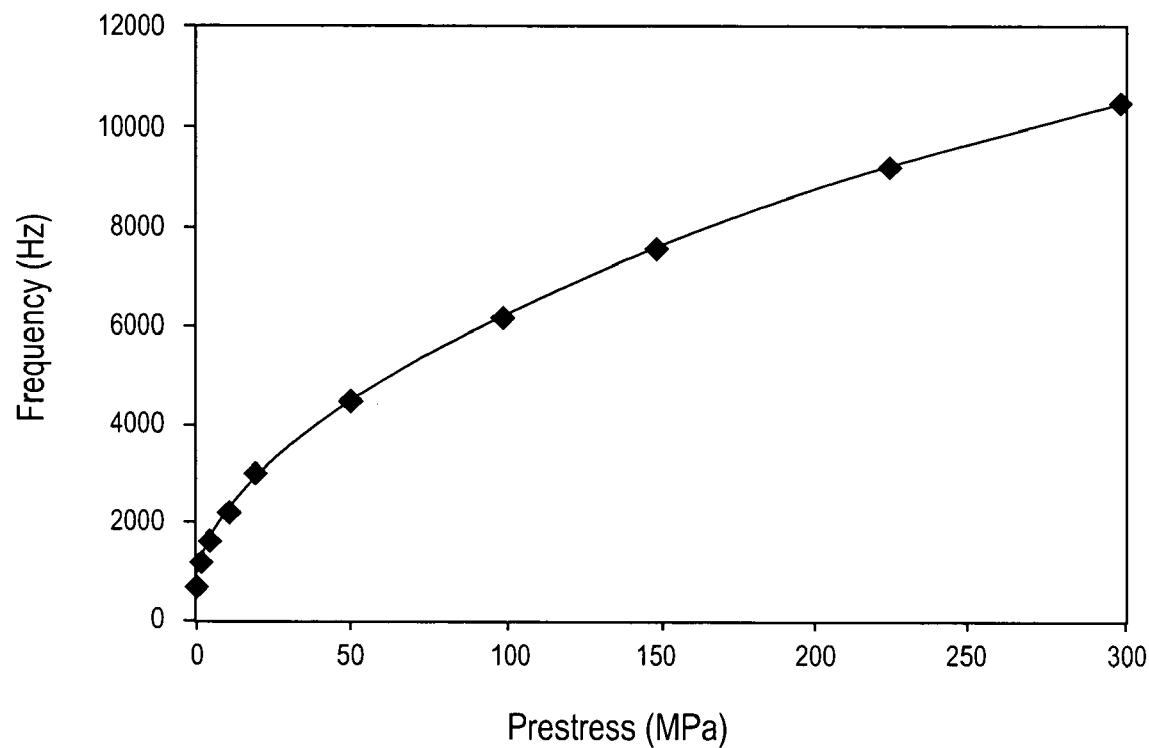
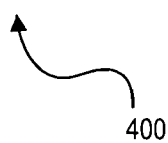
FIG. 4

THERMALLY TUNED FILTER HAVING A PRE-STRESSED MEMBRANE

BACKGROUND

1. Field of Invention

The field of invention relates generally to tunable lasers and, more specifically but not exclusively, relates to a thermally tuned filter having a pre-stressed membrane.

2. Background Information

Networks provide the infrastructure for many forms of communication. LANs (Local Area Network), WANs (Wide Area Network), MANs (Metropolitan Area Network), and the Internet are common networks. Optical networks are growing in popularity as more optical fiber is deployed. Optical transmissions offer higher bandwidth and less susceptibility to electromagnetic interference than transmissions over copper cable.

Wavelength Division Multiplexing (WDM) increases the capacity of optical fiber. WDM involves sending two or more optical signals having different wavelengths through an optical fiber. The optical signals are separated by wavelength at the receiving end. WDM allows increasing the capacity of an optical network without increasing the amount of optical fiber. Dense Wavelength Division Multiplexing (DWDM), which is a higher-capacity version of WDM, is also becoming popular in optical communication systems.

Tunable lasers are useful in WDM systems because they alleviate the need to have a separate source laser for each wavelength to be transmitted on an optical fiber. Tunable lasers have the ability to change the wavelength of their outputted optical signal. Tunable lasers are also useful in optical packet-switched networks where data is sent in packets on different wavelengths. However, components of a conventional tunable laser are susceptible to failure from vibration, shock, and other stresses that may occur during assembly and deployment of the laser.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

FIG. 2B is a side view diagram illustrating one embodiment of a thermally tuned filter in accordance with the teachings of the present invention.

FIG. 3 is a perspective view diagram illustrating one embodiment of a thermally tuned filter in accordance with the teachings of the present invention.

FIG. 4 is a graph illustrating one embodiment of filter natural frequency versus membrane prestress in accordance with the teachings of the present invention.

DETAILED DESCRIPTION

Embodiments of a thermally tuned filter having a pre-stressed membrane are described herein. In the following description, numerous specific details are set forth to provide a thorough understanding of embodiments of the invention. One skilled in the relevant art will recognize, however, that embodiments of the invention can be practiced without one or more of the specific details, or with other methods, components, materials, etc. In other instances, well-known structures, materials, or operations are not shown or described in detail to avoid obscuring aspects of the invention.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

Figure 1:
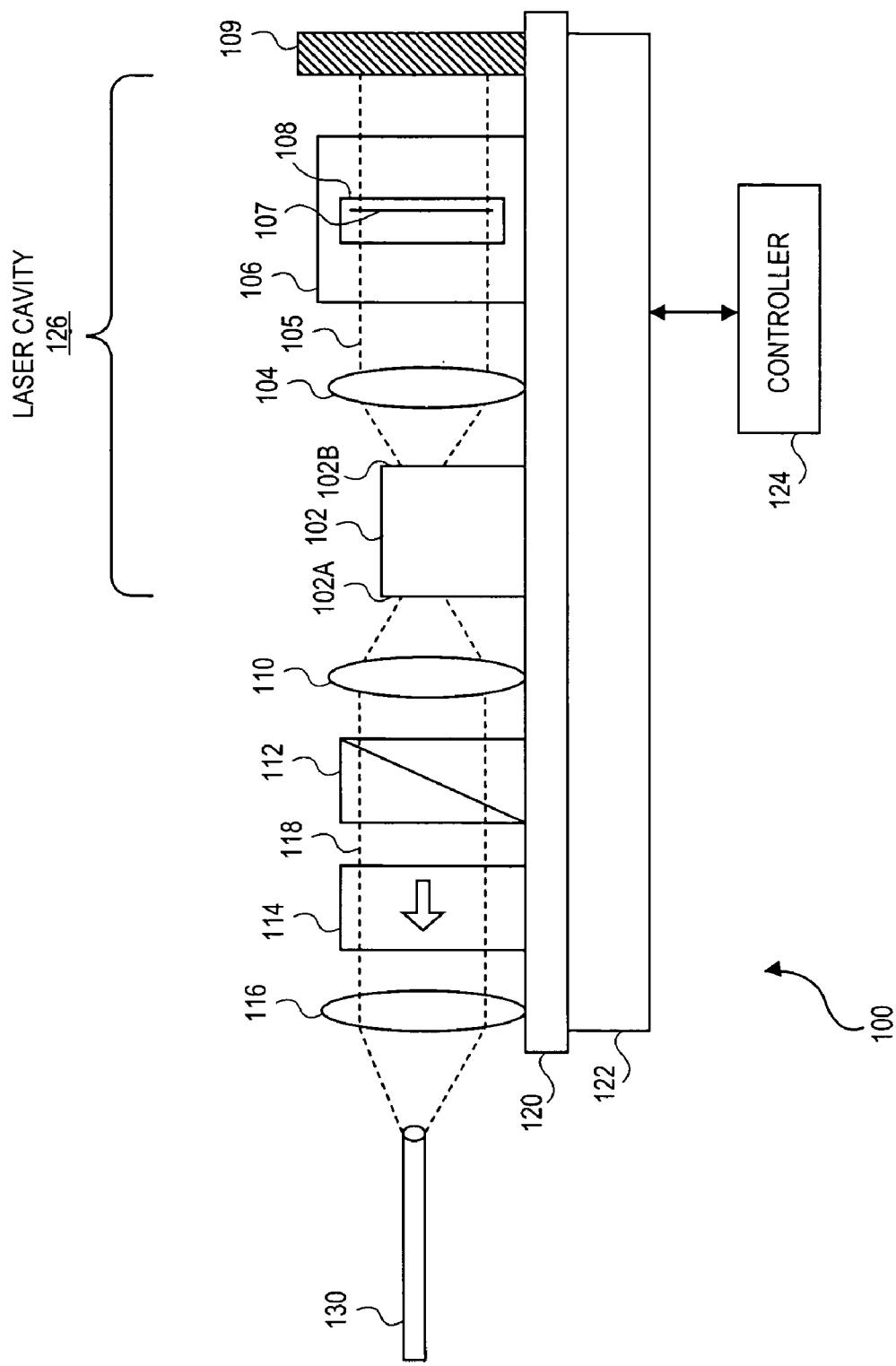
FIG. 1 is a block diagram illustrating one embodiment of a tunable laser in accordance with the teachings of the present invention.

FIG. 1 illustrates a tunable laser 100 according to one embodiment of the present invention. In one embodiment, tunable laser 100 is an external cavity diode laser (ECDL). Tunable laser 100 includes a gain medium 102 and a reflector 109. Gain medium 102 may include a Fabry-Perot diode gain chip, an InGaAsP/InP laser diode, or the like. Gain medium 102 includes a first output facet 102A and a second output facet 102B. In one embodiment, first output facet 102A is partially reflective and second output facet 102B has an anti-reflection (AR) coating. Reflector 109 may include a mirror, grating, prism, or the like. A laser cavity 126 is defined by first output facet 102A and reflector 109, and has a length L. In another embodiment, reflector 109 may be curved such that lens 104 may be eliminated. Gain medium 102 emits an optical beam 105 from the second output facet 102B that is collimated by lens 104. Light from optical beam 105 is reflected from reflector 109 back to gain medium 102.

A thermal tuner 106 is positioned in the optical beam 105 between lens 104 and reflector 109. Thermal tuner 106 includes a thermally tuned filter 108. Thermally tuned filter 108 may also be referred to as a wavelength filter. In operation, the wavelength of the output signal of laser 100 may be adjusted through thermal tuning of thermal tuner 106. In general, by adjusting the heat to at least a portion of thermal tuner 106, the optical characteristics of the thermal tuner 106 are changed to tune the laser to various wavelengths. In tunable laser 100, heat is provided to filter 108 to tune laser 100. In order to maintain thermal stability and control, the thermal tuner usually has a high degree of thermal isolation from surrounding structures and packaging. In one embodiment, a pre-stressed membrane 107 is used in thermally isolating filter 108.

In one embodiment, thermal tuner 106 may include two thermally tuned filters having slightly different periods. In another embodiment, two such filters are used to tune laser 100 using Vernier tuning. In Vernier tuning, a large net transmission is generated only where both filters have a large transmission. Embodiments of thermally tuned filter 108 will be discussed further below.

It will be appreciated that other methods of tuning laser 100 in conjunction with the tuning of thermal tuner 106 described herein may be used to change the output wavelength of laser 100. In one embodiment, the output of tunable laser 100 may be tuned by adjusting the length of laser cavity 126 by moving reflector 109 through thermal or mechanical mechanisms, or the like. In other embodiments, tunable laser 100 may be tuned by mechanically or thermally adjusting one or more etalons positioned in optical beam 105. In another embodiment, laser 100 may be tuned by changing the refractive index of gain medium 102 through thermal control. In other embodiments, laser 100 may be tuned through acousto-optics, electro-optics, or the like.

Platform 120 is thermally coupled to thermoelectric cool (TEC) 122 to control the temperature of platform 120 using thermal conduction. A controller 124 is coupled to TEC 122 to provide control information to TEC 122 to control the heating and cooling of platform 120. In one embodiment, platform 120 includes a ceramic substrate.

Controller 124 may include a conventional processor to provide signals to TEC 122 for selective temperature control of platform 120. Each of gain medium 102, lens 104, and reflector 109 may be thermally coupled to platform 120, or each thermally insulated from platform 120, or any combination thereof.

An optical beam 118 is emitted from first output facet 102A. Optical beam 118 is collimated by lens 110 and focused by lens 116. A beam splitter 112 and an optical isolator 114 are positioned in optical beam 118 between lens 110 and lens 116. In one embodiment, optical isolator 114 prevents reflections from returning toward gain medium 102.

In one embodiment, beam splitter 112 picks off a portion of optical beam 118. This portion may be used to derive feedback signals to adjust the tuning of tunable laser 100. Tuning of tunable laser 100 may also be monitored and adjusted by measuring the voltage across gain medium 102, inserting a dither element into optical beam 105, or positioning photodiodes in laser 100 to detect light associated with laser 100.

Optical beam 118 is focused by lens 116 into an optical fiber 130. In one embodiment, optical fiber 130 is supported by a ferrule (not shown). Lens 116 and 110, optical isolator 114 and beam splitter 112 may each be thermally coupled to platform 120, be thermally insulated from platform 120, or any combination thereof.

Figure 2A:
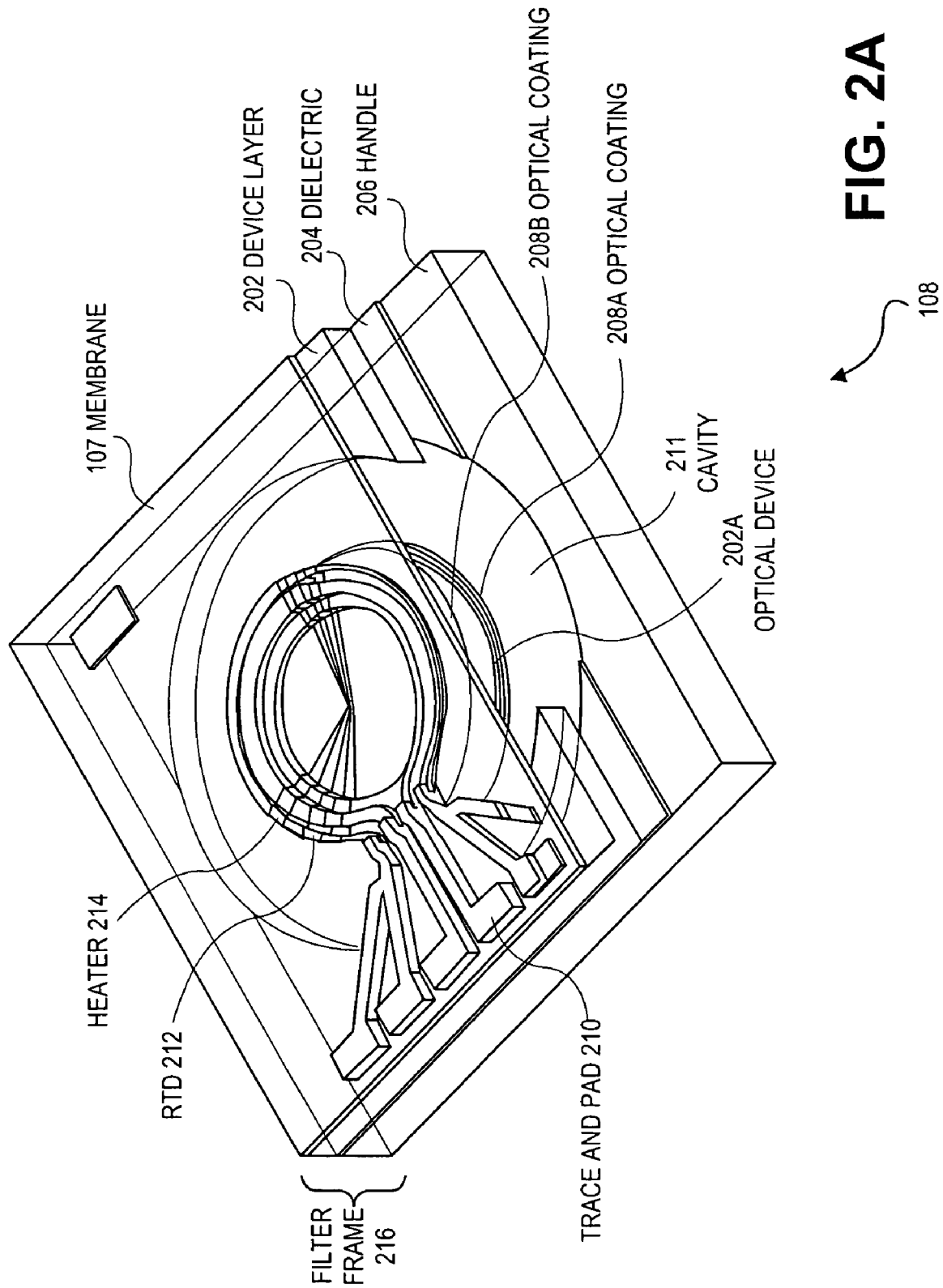
FIG. 2A is a perspective view diagram illustrating one embodiment of a thermally tuned filter in accordance with the teachings of the present invention.

Turning to FIGS. 2A and 2B, a perspective view and a side view of an embodiment of thermally tuned filter 108 are shown. A dielectric layer 204 is layered over a handle layer 206. In one embodiment, dielectric layer 204 includes Silicon Dioxide ($SiO_2$). In another embodiment, the handle layer 206 includes Silicon (Si).

A device layer 202 is layered onto the dielectric layer 204. In one embodiment, the device layer 202 includes Silicon (Si). The device layer 202 includes optical device 202A. A cavity 211 is formed in the handle layer 206 and the dielectric layer 204. In one embodiment, the optical device 202A has optical coatings 208A and 208B on two surfaces of the device 202A that are substantially perpendicular to optical beam 105. A filter frame 216 includes the outer edge surrounding the filter 108.

Layered onto device layer 202 is the pre-stressed membrane 107. Membrane 107 is a thin film that serves as thermal isolation of the filter 108 from other parts of laser 100. In one embodiment, the pre-stressed membrane 107 includes Silicon Nitride ($Si_3N_4$). In another embodiment, pre-stressed membrane 107 is approximately 0.8 microns thick. In yet another embodiment, the thickness of optical device 202A is approximately 100 times more than the thickness of pre-stressed membrane 107. In the embodiment of FIGS. 2A and 2B, the optical device 202A is supported at least partially by pre-stressed membrane 107. Cavity 211 extends into the device layer 202, such that the cavity 211 surrounds sides of optical device 202A. In one embodiment, portions of pre-stressed membrane 107 may be the only component isolating cavity 211 from other parts of tunable laser 100.

Thermally tuned filter 108 may include a heater 214 and a resistance temperature detector (RTD) 212. Heater 214 is used to change the temperature of optical device 202A to tune the wavelength of the outputted optical signal of laser 100. In one embodiment, heat changes the index of the optical device 202A to change the length of the optical cavity 126. In another embodiment, heat changes the characteristics of gratings within the optical device 202A. Heater 214 may include Platinum (Pt), Titanium (Ti), or the like. RTD 212 measures the temperature at various places within the filter 108. RTD 212 may include Platinum (Pt), Titanium (Ti), or the like.

Thermally tuned filter 108 may include a trace and pad structure 210 to provide electrical connections to the heater 214 and RTD 212. In one embodiment, the trace and pad 210 is layered onto membrane 107, as shown in FIG. 2B. Trace and pad structure 210 may include Titanium (Ti), Gold (Au), or the like.

Membrane 107 is pre-stressed in order to increase the natural frequency of filter 108. The prestress level in the membrane 107 may be controlled during the formation of the membrane. When the membrane 107 is grown as a thin film on a surface, varying amounts of prestress may be created within the film by adjusting the proportions and processing elements of the material of membrane 107. In one embodiment, tensile prestress may be added to membrane 107. In other embodiments, tensile prestress and compressive prestress may be added to membrane 107.

For example, a membrane grown from Silicon Nitride ($Si_3N_4$) without prestress may result in a filter 108 having a natural frequency of about 655 Hertz (Hz). However, in one embodiment, with 225 Mega-Pascal's (MPa) of tensile prestress applied to membrane 107, the natural frequency of filter 108 is raised from 655 Hz to 9210 Hz, an increase of about 13 times. The prestress increases the stiffness of filter 108 and thus the ability for the filter 108 to resist vibration and shock.

FIG. 3 shows a modal analysis of an embodiment of thermally tuned filter 108. The shaded regions of FIG. 3 show normalized displacement of the filter from 0 to 1. The modal analysis in FIG. 3 was created using Finite Element Analysis (FEA).

FIG. 4 shows a graph 400 of filter natural frequency (Hz) versus prestress (MPa) of an embodiment of membrane 107. In graph 400, the membrane thickness is about 800 nanometers (nm) and the thickness of the optical device 208A is about 151 micrometers (um). In graph 400, the y-axis shows filter natural frequency (Hz). The x-axis shows the amount of prestress of the membrane (MPa).

Figure 5:
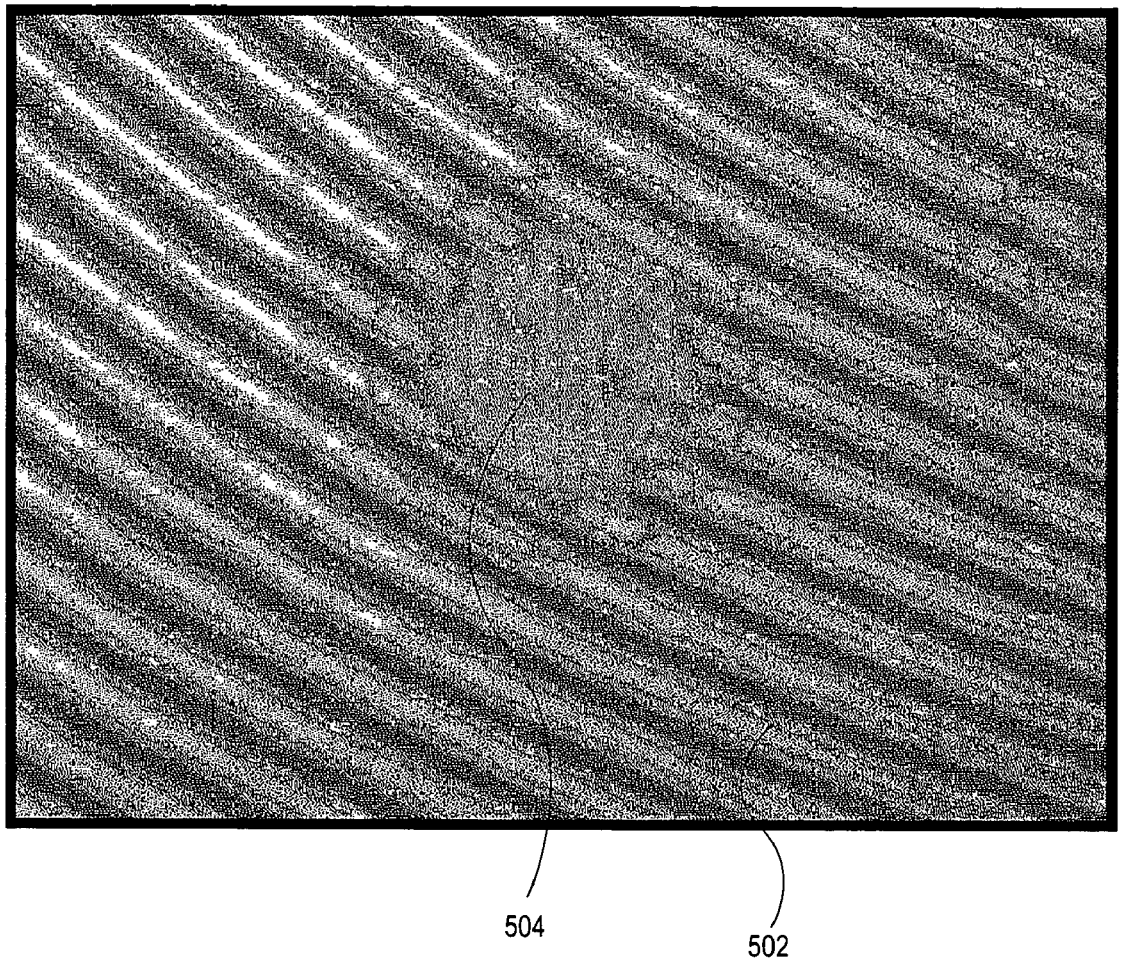
FIG. 5 is a diagram illustrating one embodiment of a thermally tuned filter in accordance with the teachings of the present invention.

FIG. 5 is an illustration of an optical image of an embodiment of a thermally tuned filter 108. In the embodiment imaged in FIG. 5, the thickness of membrane 107 is 400 nm and the thickness of optical device 208A is 400 um. Without prestress, the natural frequency of the filter is about 313 Hz, based on finite element analysis. With 150 MPa of prestress, natural frequency of the filter 108 is increased to 2723 Hz.

FIG. 5 shows filter 108 at resonance with 2723 Hz of acoustic excitation during a test. In FIG. 5, the striped area, shown generally at 502, indicates little movement by these areas of the filter in response to the acoustic excitation. The blurred area, shown generally at 504, indicates this area of the filter has reached its natural frequency of 2723 Hz. Area 504 is blurred because this area is moving more than the area shown at 502. A numerical simulation of the test shown in FIG. 5 indicated a natural frequency within 7% of the results of the FIG. 5 test.

In one embodiment, the amount of prestress applied to the membrane 107 may take into consideration not only the mechanical resonance of the filter 108, but also the operational conditions of filter 108. Managing the difference between the temperature of the filter frame and the temperature of the center of the filter may be used to change the stress of the pre-stressed membrane. In some embodiments, the temperature difference may affect the tensile stress, or the compressive stress, or both, of the pre-stressed membrane.

In one embodiment of laser 100, filter 108 is mounted on a ceramic substrate, shown as platform 120 in FIG. 1. In one embodiment, the ceramic substrate may be maintained at a temperature of approximately 25–30° Celsius (C.). In another embodiment, the temperature of the ceramic substrate is regulated using the TEC 122 via heat conduction through platform 120.

To adjust the tuning of the output wavelength of the laser, the center of filter 108 is heated. In FIG. 2A, heater 214 is used to heat the optical device 202A. In one embodiment, the temperature difference between the optical device 202A and the filter frame 216 may be up to 80° C.

Figure 6:
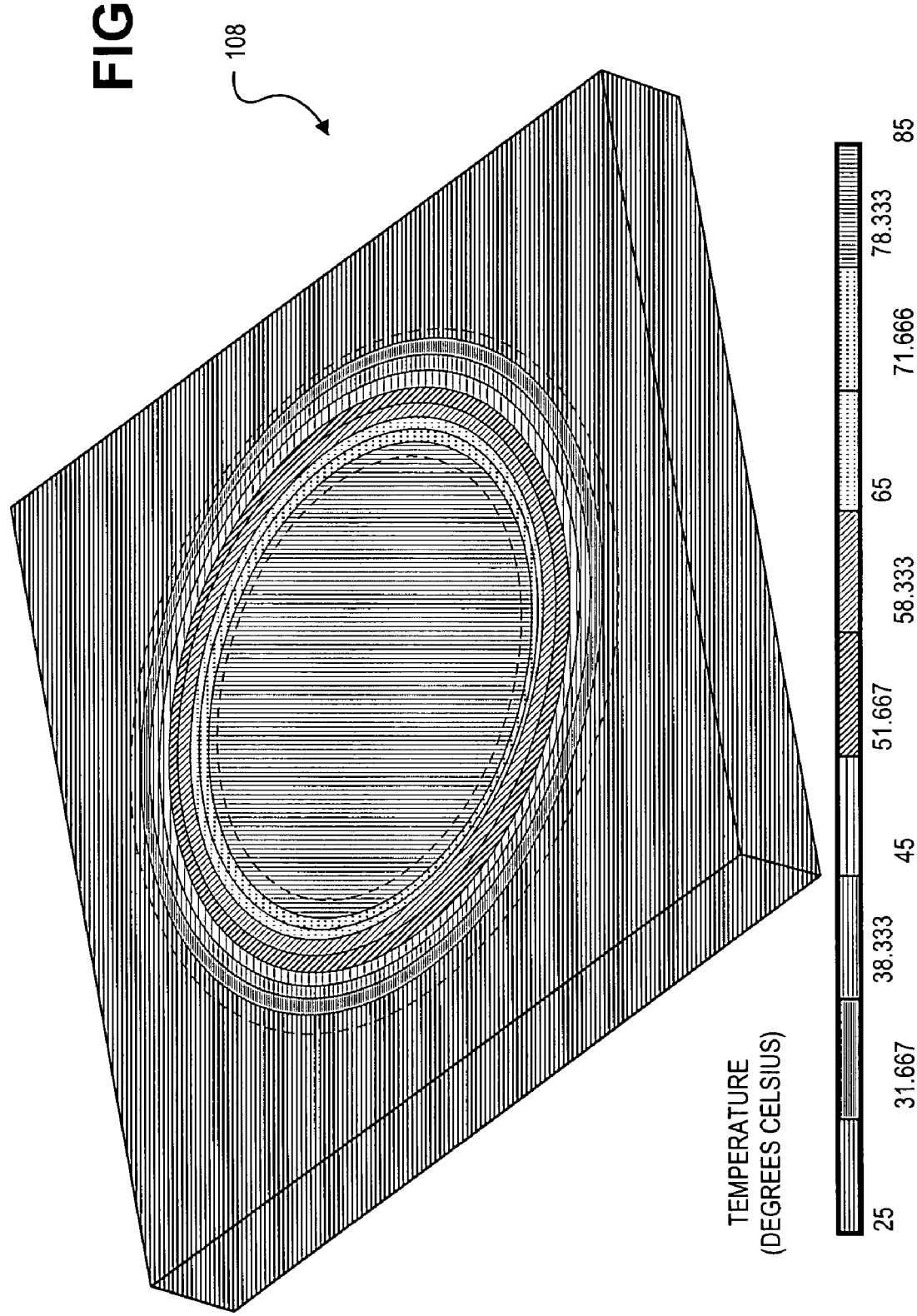
FIG. 6 is a perspective view diagram illustrating one embodiment of a thermally tuned filter in accordance with the teachings of the present invention.

In an embodiment of thermally tuned filter 108 having a frequency of 250 Gigahertz (GHz), the amount of membrane prestress lost at a temperature difference of 60° C. is 107 MPa. FIG. 6 shows the distribution of temperature across the 250 GHz filter when the difference between the optical device 208A and the filter frame 216 is approximately 60° C. As shown in FIG. 6, filter frame 216 is at 25° C. and the center of the filter is at 85° C.

Figure 7:
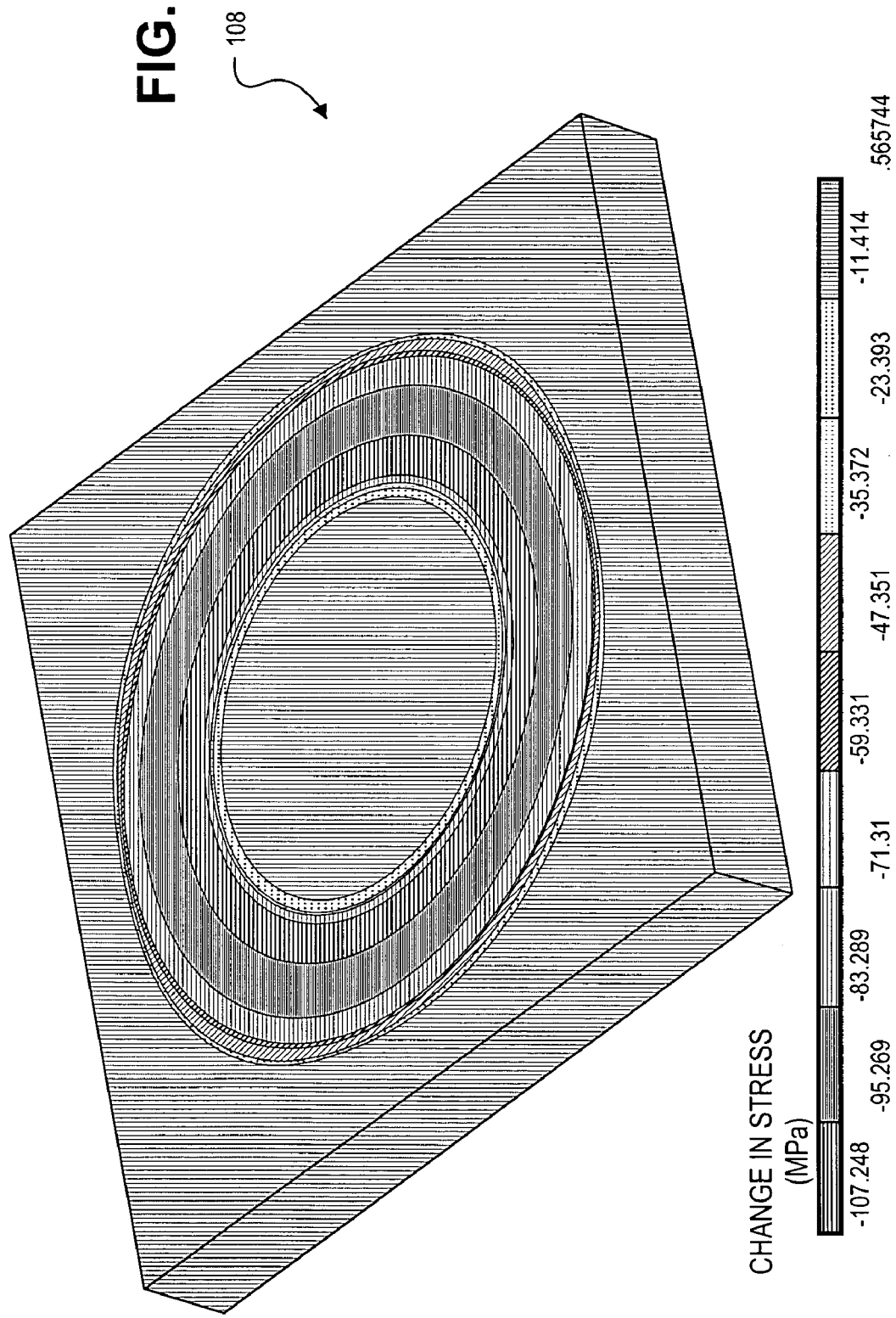
FIG. 7 is a perspective view diagram illustrating one embodiment of a thermally tuned filter in accordance with the teachings of the present invention.

FIG. 7 shows the amount of filter stress change across the 250 GHz filter described above in conjunction with FIG. 6. As shown in FIG. 7, approximately 83–107 MPa of stress is lost from portions of pre-stressed membrane 107. The portions of membrane 107 indicating the most stress loss are generally the portions of membrane 107 proximate to cavity 211.

Figure 8:
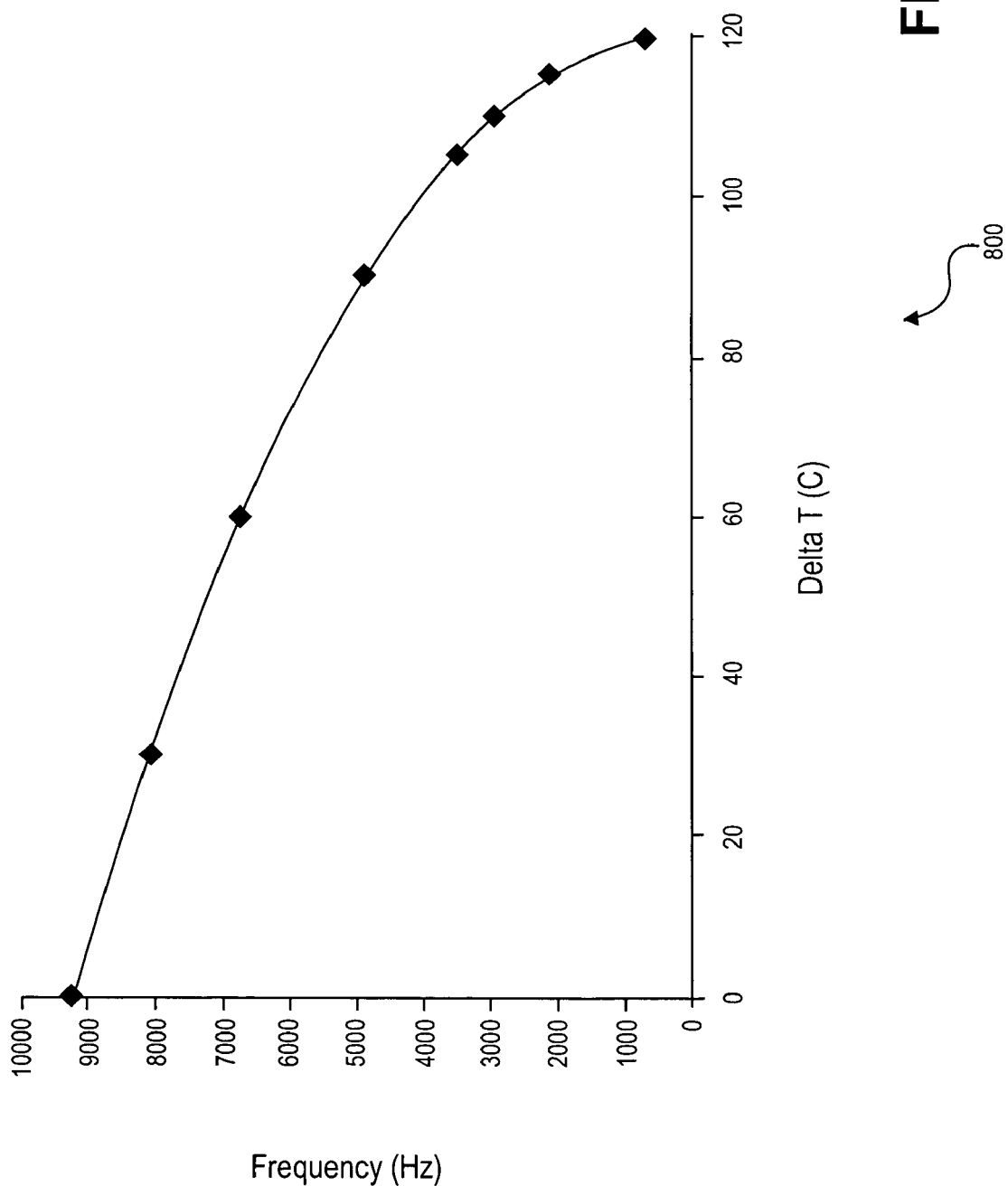
FIG. 8 is a graph illustrating one embodiment of filter natural frequency versus the difference between filter center temperature and filter frame temperature in accordance with the teachings of the present invention.

FIG. 8 shows a graph 800 of filter natural frequency (Hz) versus filter temperature difference (° C.) of the 250 GHz thermally tuned filter described above. In graph 800, the axis labeled "Delta T (C)" illustrates the difference in temperature between optical device 208A and the filter frame 216. As shown in graph 800, at Delta T of 120° C., the natural frequency of the filter is less than 1000 Hz, indicating the membrane tensile prestress has almost been eliminated. A further increase in Delta T may cause the filter to buckle.

Figure 9:
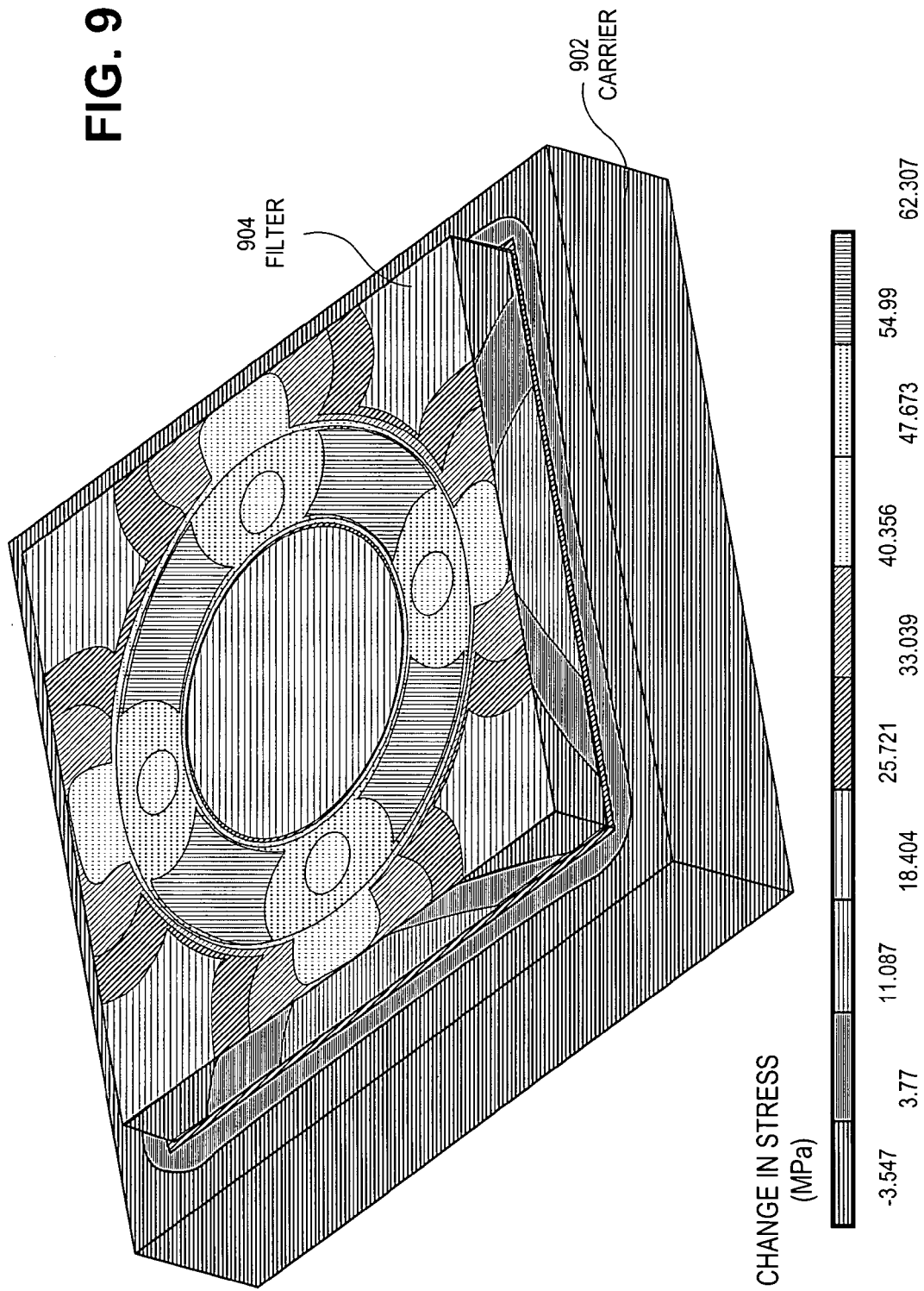
FIG. 9 is a perspective view diagram illustrating one embodiment of a thermally tuned filter mounted to a filter carrier in accordance with the teachings of the present invention.

In another embodiment, membrane prestress may also be affected by filter carrier material and the method of mounting the filter to the carrier. In the embodiment of FIG. 9, a thermally tuned filter 904 having a prestressed membrane is mounted to a filter carrier 902. In one embodiment, filter carrier 902 includes a ceramic substrate. A mismatch between the material of the filter 904 and the material of the filter carrier 902 may result in a reduction in membrane stress. For example, aluminum nitride (AlN) has a high thermal conductivity and high coefficient of thermal expansion (CTE). Since the CTE of AlN in the carrier material is higher than the CTE of the filter, the net stress of the membrane is reduced.

In one embodiment, the Invar® family of material may be used in the filter carrier 902. Generally, Invar is an iron-nickel alloy, but may contain other substances. Invar structures usually have a low CTE. The CTE of Invar is generally smaller than the CTE of the thermally tuned filter. As shown in the embodiment of FIG. 9, the membrane stress is increased after filter attachment due to the low CTE of Invar. In one embodiment, the tensile stress of the membrane is increased.

In the embodiment of FIG. 9, the filter carrier made from Invar resulted in an increase of 62 MPa to the stress of the pre-stressed membrane 107. In the embodiment of FIG. 9, Epoxy is used to attach the filter to the filter carrier with a curing temperature of 150° C.

Table 1 shows the change in membrane stress using different carrier material and different materials to mount the filter to the carrier.

TABLE 1

| Membrane stress at 20° C. | Epoxy (H20E) | Solder (AuSn) |
| --- | --- | --- |
| AlN carrier | −41.8 MPa | −237 MPa |
| Invar carrier | 62.3 MPa | 199 MPa |
| Curing/melting temperature | 150° C. | 280° C. |

For example, in Table 1, a carrier including Invar attached to the filter using epoxy H20E at a curing temperature of 150° C. resulted in increasing the stress of the membrane by 62.3 MPA, when the membrane was at 20° C.

Embodiments of a thermally tuned filter having a pre-stressed membrane to increase the natural frequency of the filter are described herein. In one embodiment, the level of prestress is generated while forming the membrane. Adding prestress to the membrane does not require any additional parts or burdensome processing procedures. The level of prestress may be adjusted depending on the operational environment of the tunable laser.

Embodiments of the thermal tuner are much greater in size than the size of the pre-stressed membrane. The mechanical resonance of a filter without a pre-stressed membrane may be at low frequencies making such a membrane susceptible to damage from vibration and shock. By using embodiments of a pre-stressed membrane as described herein, the overall natural frequency of the thermally tuned filter is increased making the filter more resistant to damage during the assembly process, testing, and deployment in the field.

Further, having a pre-stressed membrane counteracts stresses that may occur from movement of the optical device in the filter. In some embodiments, the pre-stressed membrane counteracts stresses applied from the load of holding an optical device. Also, the optical device may attempt to sway or jiggle during physical movement of the laser. In other embodiments, when the temperature of the optical device is changed during operation, the optical device may expand or contract, thus applying stresses to the pre-stressed membrane.

Filters according to the embodiments described herein have passed vibration and shocks tests and have met standards promulgated by Telcordia Technologies. Telcordia Technologies produces a series of documents known in the industry as "Telcordia Specifications" or "Generic Requirements (GRs)." Telcordia specifications are available at Telcrodia Technologies website.

Figure 10:
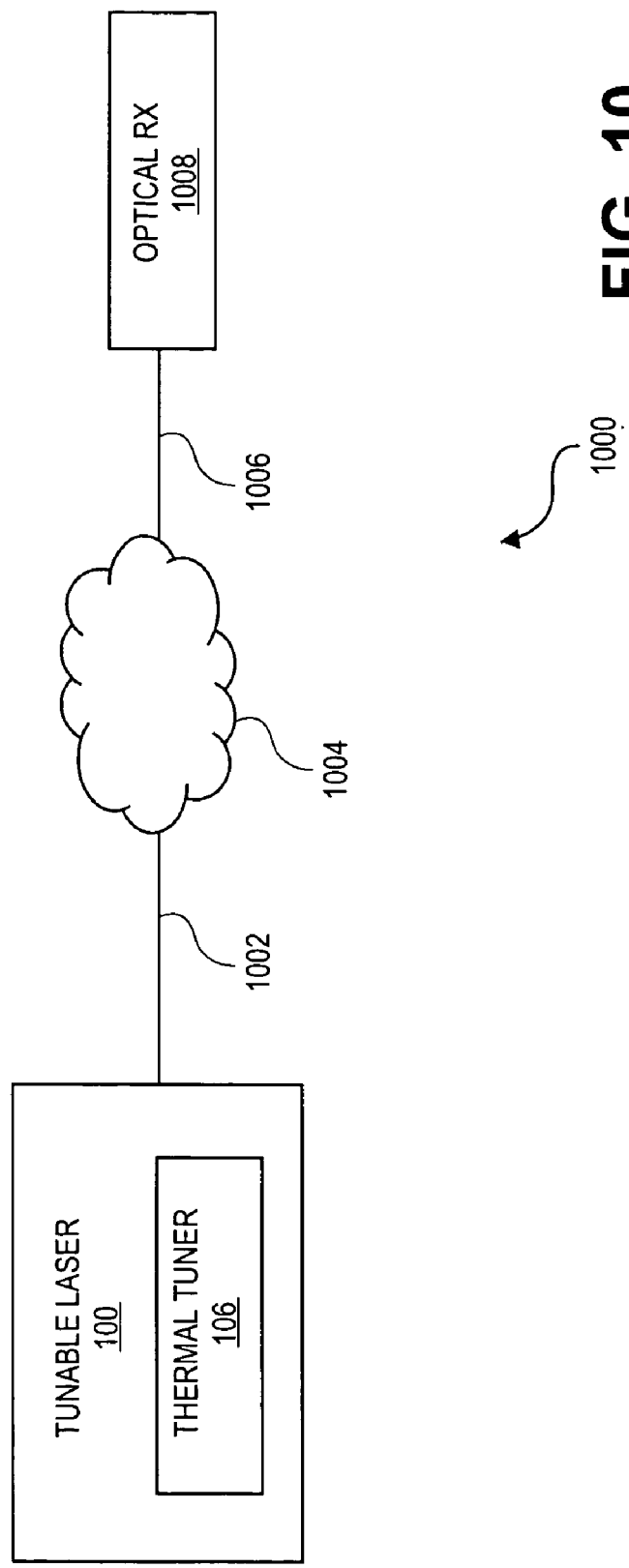
FIG. 10 is a block diagram illustrating one embodiment of a communication system in accordance with the teachings of the present invention.

FIG. 10 shows one embodiment of a communication system 1000. Tunable laser 100 includes thermal tuner 106. Thermal tuner 106 includes at least one thermally tuned filter having a pre-stressed membrane, as described herein. Tunable laser 100 outputs an optical signal at a first wavelength. In one embodiment, the optical signal is tuned from the first wavelength to a second wavelength using thermal tuner 106. The optical signal is outputted to an optical channel 1002 optically coupled to laser 100. The optical channel 1002 is optically coupled to a network 1004. Network 1004 is optically coupled to an optical channel 1006. An optical receiver 1008 is optically coupled to optical channel 1006 to receive the optical signal. In one embodiment, the optical channels 1002 and 1006 include optical fiber.

The above description of illustrated embodiments of the invention, including what is described in the Abstract, is not intended to be exhaustive or to limit the invention to the precise forms disclosed. While specific embodiments of, and examples for, the invention are described herein for illustrative purposes, various equivalent modifications are possible within the scope of the invention, as those skilled in the relevant art will recognize.

These modifications can be made to embodiments of the invention in light of the above detailed description. The terms used in the following claims should not be construed to limit the invention to the specific embodiments disclosed in the specification and the claims. Rather, the scope of the invention is to be determined by the following claims, which are to be construed in accordance with established doctrines of claim interpretation.

What is claimed is:

1. A thermally tuned filter, comprising:
a handle layer;
a dielectric layer positioned proximate to the handle layer;
a device layer positioned proximate to the handle layer, the device layer including an optical device; and
a pre-stressed membrane positioned proximate to the device layer, a tensile prestress of the pre-stressed membrane to increase a natural frequency of the thermally tuned filter.

2. The thermally tuned filter of claim 1 wherein a thickness of the pre-stressed membrane is less than 1 micrometer.

3. The thermally tuned filter of claim 1 wherein a thickness of the optical device is approximately 100 times more than a thickness of the pre-stressed membrane.

4. The thermally tuned filter of claim 1 wherein the pre-stressed membrane includes silicon nitride ($Si_3N_4$).

5. The thermally tuned filter of claim 1 wherein the tensile prestress is applied during formation of the pre-stressed membrane.

6. The thermally tuned filter of claim 1, further comprising a filter frame surrounding the thermally tuned filter, a difference between a temperature of the filter frame and a temperature of the optical device to change a stress of the pre-stressed membrane to change the natural frequency of the thermally tuned filter.

7. The thermally tuned filter of claim 1, further comprising a filter carrier mounted to the thermally tuned filter with a mounting material, the filter carrier and the mounting material to increase a tensile stress of the pre-stressed membrane to increase the natural frequency of the thermally tuned filter.

8. The thermally tuned filter of claim 1, further comprising a heater thermally coupled to the optical device to change a temperature of the optical device.

9. The thermally tuned filter of claim 8, further comprising a thermometer thermally coupled to the optical device to measure the temperature of the optical device.

10. A tunable laser, comprising:
a gain medium including a first output facet and a second output facet, the gain medium to emit an optical beam from the second output facet;
a reflector positioned in the first optical beam wherein the first output facet and the reflector define an optical cavity; and
a thermal tuner positioned in the first optical beam between the second output facet and the reflector, the thermal tuner comprising a thermally tuned filter including a pre-stressed membrane, a tensile prestress of the pre-stressed membrane to increase a natural frequency of the thermally tuned filter.

11. The tunable laser of claim 10, further comprising:
a platform thermally coupled to the thermal tuner; and
a thermo-electric cooler (TEC) thermally coupled to the platform to provide thermal control of the thermal tuner via the platform.

12. The tunable laser of claim 11, further comprising a filter frame surrounding the thermally tuned filter, a difference between a temperature of the filter frame and a temperature of a center of the thermally tuned filter to change a stress of the pre-stressed membrane to change the natural frequency of the thermally tuned filter.

13. The tunable laser of claim 12 wherein the temperature of the filter frame is adjusted by the TEC via the platform.

14. The tunable laser of claim 10, further comprising a filter carrier mounted to the thermally tuned filter with a mounting material, the filter carrier and the mounting material to increase a tensile stress of the pre-stressed membrane to increase the natural frequency of the thermally tuned filter.

15. A thermally tuned filter, comprising:
a handle layer;
a dielectric layer positioned proximate to the handle layer;
a device layer positioned proximate to the handle layer, the device layer including an optical device; and
means for increasing a natural frequency of the thermally tuned filter.

16. The thermally tuned filter of claim 15 wherein the means for increasing the natural frequency includes a pre-stressed membrane.

17. The thermally tuned filter of claim 16, further comprising a filter frame surrounding the thermally tuned filter, a difference between a temperature of the filter frame and a temperature of the optical device to change a stress of the pre-stressed membrane to change the natural frequency of the thermally tuned filter.

18. The thermally tuned filter of claim 16, further comprising a filter carrier mounted to the thermally tuned filter with a mounting material, the filter carrier and the mounting material to increase a tensile stress of the pre-stressed membrane to increase the natural frequency of the thermally tuned filter.

19. A method, comprising:
generating an optical beam by a gain medium of a tunable laser;
directing the optical beam through a thermally tuned filter of the tunable laser, wherein the thermally tuned filter includes a pre-stressed membrane including a prestress to increase a natural frequency of the thermally tuned filter;
outputting an optical signal from the tunable laser at a first wavelength; and
tuning the thermally tuned filter to tune the optical signal from the first wavelength to a second wavelength.

20. The method of claim 19 wherein tuning the thermally tuned filter comprises heating an optical device within the thermally tuned filter.

21. The method of claim 19, further comprising reducing a difference between a temperature of a filter frame surrounding the thermally tuned filter and a temperature of a center of the thermally tuned filter to increase the natural frequency of the thermally tuned filter.

22. The method of claim 19 wherein the tunable laser comprises a filter carrier mounted to the thermally tuned filter with a mounting material, the filter carrier and the mounting material to increase a tensile stress of the pre-stressed membrane to increase the natural frequency of the thermally tuned filter.

23. A system, comprising:
a tunable laser to output an optical signal, a thermally tuned filter of the tunable laser comprising:
a handle layer;
a dielectric layer positioned proximate to the handle layer;
a device layer positioned proximate to the handle layer, the device layer including an optical device; and
a pre-stressed membrane positioned proximate to the device layer, a tensile prestress of the pre-stressed membrane to increase a natural frequency of the thermally tuned filter; and
an optical fiber optically coupled to the tunable laser to transmit the optical signal.

24. The system of claim 23 wherein the thermally tuned filter includes a filter frame surrounding the thermally tuned filter, a difference between a temperature of the filter frame and a temperature of the optical device to change a stress of the pre-stressed membrane to change the natural frequency of the thermally tuned filter.

25. The system of claim 23 wherein the thermally tuned filter includes a filter carrier mounted to the thermally tuned filter with a mounting material, the filter carrier and the mounting material to increase a tensile stress of the pre-stressed membrane to increase the natural frequency of the thermally tuned filter.

26. A system, comprising:
a first tunable laser including a first thermally tuned filter, wherein the first thermally tuned filter includes a pre-stressed membrane, a tensile prestress of the pre-stressed membrane to increase a natural frequency of the first thermally tuned filter; and
a controller operatively coupled to the first tunable laser to provide tuning signals to the first tunable laser.

27. The system of claim 26 wherein the first tunable laser includes a second thermally tuned filter optically coupled to the first thermally tuned filter, wherein the first thermally tuned filter and the second thermally tuned filter to tune the first tunable laser using Vernier tuning.

28. The system of claim 26, further comprising a second tunable laser operatively coupled to the controller, the controller to provide tuning signals to the second tunable laser.

29. The system of claim 28, further comprising an optical channel optically coupled to the first tunable laser and the second tunable laser, the optical channel to receive a first optical signal from the first tunable laser at a first wavelength and to receive a second optical signal from the second tunable laser at a second wavelength.

* * * * *